United States Patent
Lee et al.

(10) Patent No.: US 6,759,299 B2
(45) Date of Patent: Jul. 6, 2004

(54) METHOD FOR MANUFACTURING FLASH MEMORY DEVICE

(75) Inventors: Young Bok Lee, Ichon (KR); Sung Mun Jung, Kyungki-Do (KR); Jung Ryul Ahn, Namyangju (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/321,720

(22) Filed: Dec. 18, 2002

(65) Prior Publication Data

US 2004/0014285 A1 Jan. 22, 2004

(30) Foreign Application Priority Data

Jul. 18, 2002 (KR) .................................. 10-2002-0042159

(51) Int. Cl.[7] ......................................... H01L 21/8247
(52) U.S. Cl. ...................................... 438/258; 438/275
(58) Field of Search ................................ 438/257–267, 438/275

(56) References Cited

U.S. PATENT DOCUMENTS

| | | | | |
|---|---|---|---|---|
| 4,630,356 A | * | 12/1986 | Christie et al. | 438/444 |
| 6,159,795 A | * | 12/2000 | Higashitani et al. | 438/257 |
| 6,420,222 B1 | * | 7/2002 | Watanabe | 438/201 |
| 2003/0003660 A1 | * | 1/2003 | Hsu et al. | 438/258 |
| 2003/0008458 A1 | * | 1/2003 | Hashimoto et al. | 438/258 |

* cited by examiner

*Primary Examiner*—Richard A. Booth
(74) *Attorney, Agent, or Firm*—Morgan, Lewis & Bockius LLP

(57) ABSTRACT

The present invention relates to a method of manufacturing a flash memory device. In the method, a low-voltage transistor is formed to have a DDD structure same to a high-voltage transistor when a peripheral region is formed in the manufacture process of the flash memory device. As the process for forming the LDD structure for the low voltage is omitted, the cost is reduced in the entire process of manufacturing the flash memory device. Also, as the junction breakdown voltage of the low-voltage transistor is increased and current is increased, the device characteristics is improved

10 Claims, 5 Drawing Sheets

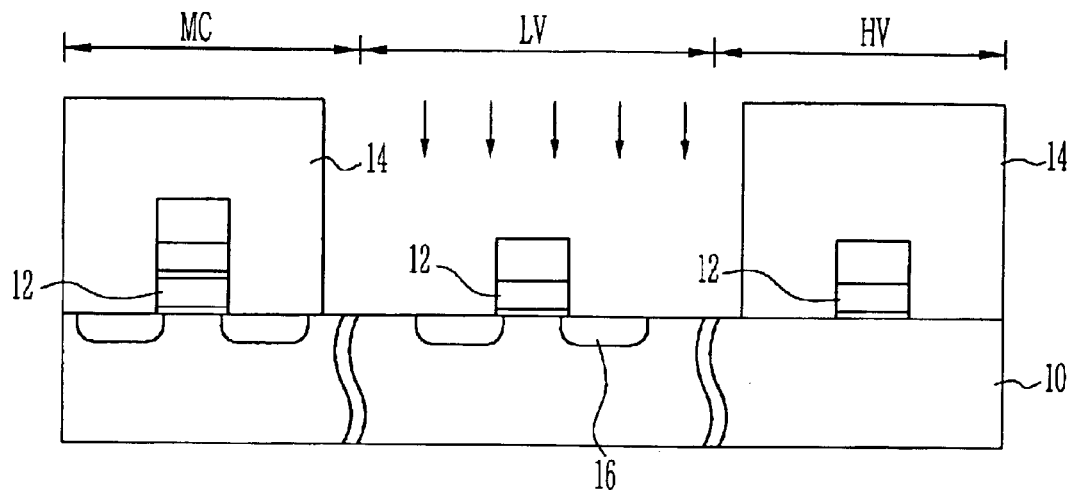
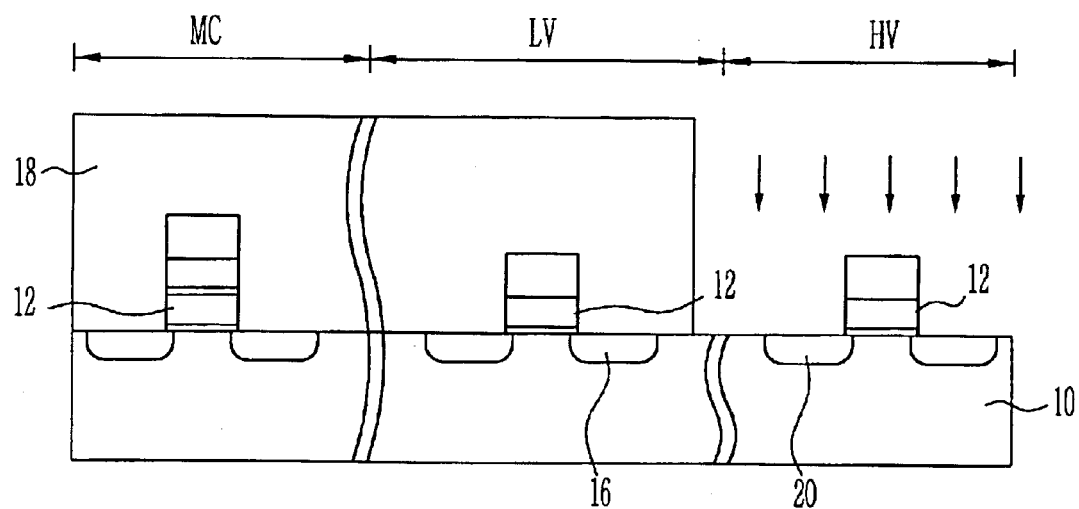

| Gate Length | 20 | 1.5 | 1 | 0.6 | 0.5 | 0.4 | 0.35 | 0.32 | 0.3 | 0.27 | 0.24 | 0.2 |
|---|---|---|---|---|---|---|---|---|---|---|---|---|
| LVN LDD Junction | 0.540 | 0.556 | 0.563 | 0.574 | 0.590 | 0.605 | 0.595 | 0.590 | 0.572 | 0.523 | 0.510 | 0.370 |
| LVN DDD Junction | 0.550 | 0.561 | 0.568 | 0.572 | 0.600 | 0.565 | 0.526 | 0.474 | 0.365 | 0.277 | - | - |

| Gate Length | 20 | 1.5 | 1 | 0.6 | 0.5 | 0.4 | 0.35 | 0.32 | 0.3 | 0.27 | 0.24 | 0.2 |
|---|---|---|---|---|---|---|---|---|---|---|---|---|
| LVN LDD Junction | 20 | 198 | 259 | 348 | 420 | 418 | 449 | 470 | 487 | 526 | 571 | 682 |
| LVN LDD Junction | 21 | 205 | 272 | 376 | 380 | 482 | 536 | 581 | 621 | 739 | 919 | 1305 |

METHOD FOR MANUFACTURING FLASH MEMORY DEVICE

BACKGROUND OF THE INVENTION

1. Field of the Invention

The invention relates generally to formation of a peripheral region when a flash memory device is manufactured, and more particularly to, a method of manufacturing a flash memory device by which a low-voltage transistor is formed to have a DDD junction structure when a high-voltage transistor in a peripheral region of the flash memory device is formed.

2. Description of the Prior Art

Generally, the flash memory device is divided into a cell region and a peripheral region. The peripheral region is divided into a HV (high voltage) region in which a high-voltage transistor is formed, and a LV (low voltage) region in which a low-voltage transistor is formed. The gate oxide films each formed at the cell region and the peripheral region have different thickness depending on the characteristic of each of the regions. For example, a tunnel oxide film is formed as the gate oxide film of the cell region, the gate oxide film for high voltage is formed at the HV region of the peripheral region, and the gate oxide film for low voltage is formed at the LV region.

After the gates of the high-voltage transistor and the low-voltage transistor are formed, a junction is formed. A method of forming the low-voltage transistor and the high-voltage transistor in the peripheral region of the flash memory device will be below described by reference to FIG. 1A and FIG. 1B.

In FIG. 1A and FIG. B, MC indicates a main cell section, LV indicates a region where the low-voltage transistor is formed and HV indicates a region where the high-voltage transistor is formed. Also, a reference numeral '10' represents a substrate and '12' represents the gates of each the regions.

Referring first to FIG. 1A, a LDD (lightly doped drain) junction 16 of the low-voltage transistor is formed. In other words, only a portion where the low-voltage transistor is formed is opened using a mask 14 for a low voltage. An implantation process is then performed to form the LDD junction 16.

By reference to FIG. 1B, a junction of the low-voltage transistor is formed. Only a portion where the high-voltage transistor is formed is then opened using a mask 18 for a high voltage. Next, an ion implantation process is performed to form a DDD (double doped drain) junction 20.

As the semiconductor devices become increasingly fine, the size of the peripheral region is necessarily reduced. Accordingly, there are several problems in the low-voltage transistor. For example, the performance of the transistor is degraded due to hot carrier injection. Thus, erroneous operation occurs in the transistor, which degrades the device characteristics. As described above, as the junction of the low-voltage transistor is separately formed, there are problems that the number of the process step is increased and the cost is thus increased. In case where the low-voltage transistor and the high-voltage transistor are separately formed, the device characteristics depending on the hot carrier injection will be described by reference to FIG. 2.

FIG. 2 is a graph for explaining the lifetime of the transistor when the low-voltage transistor is formed by the prior art.

As can be seen from FIG. 2, the lifetime of the low-voltage transistor formed to have the LDD junction when Vd is 3.6V is 431 hours due to the hot carrier injection. This does not satisfy a standard of 2000 hours.

SUMMARY OF THE INVENTION

The present invention is contrived to solve the above problems and an object of the present invention is to provide a method of manufacturing a flash memory device by which a low-voltage transistor is formed to have a DDD structure same to a high-voltage transistor when a peripheral region is formed in the manufacture process of the flash memory device.

The above object of the present invention is achieved by a method of manufacturing a flash memory device comprising the steps of preparing a semiconductor substrate divided into a main cell region and a peripheral region, wherein the peripheral region is divided into a high-voltage region in which a high-voltage transistor will be formed and a low-voltage region in which a low-voltage transistor will be formed according to the present invention, forming a device isolation film in the semiconductor substrate, performing a ion implantation process for forming well and a ion implantation process for controlling threshold voltage for the substrate, thus forming a well region, forming gates, forming a mask in the main cell region so that the peripheral region is opened and then performing an ion implantation process for the high-voltage region and the low-voltage region, thus forming a DDD low-concentration junction regions, forming spacers at sidewalls of the gates in the high-voltage region and the low-voltage region, and forming a mask in the main cell region so that the peripheral region is opened and then performing an ion plantation process for the high-voltage region and the low-voltage region, thus forming a DDD high-concentration junction regions.

BRIEF DESCRIPTION OF THE DRAWINGS

The aforementioned aspects and other features of the present invention will be explained in the following description, taken in conjunction with the accompanying drawings, wherein:

FIG. 1A and FIG. 1B are cross-sectional views of flash memories for explaining a prior art method of forming a low-voltage transistor and a high-voltage transistor in the peripheral region of the flash memory device;

DETAILED DESCRIPTION OF PREFERRED EMBODIMENTS

The present invention will be described in detail by way of a preferred embodiment with reference to accompanying drawings.

Figure 3A:
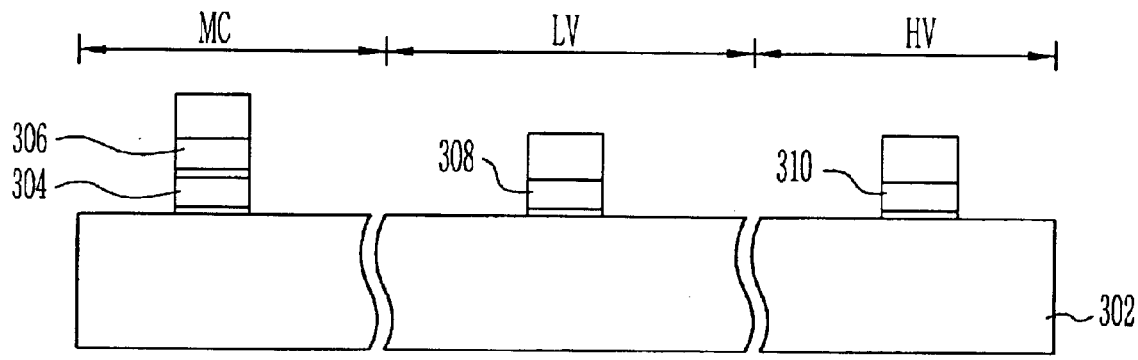
FIG. 3A through FIG. 3C are cross-sectional views of flash memories for explaining a method of manufacturing the flash memory device according to a preferred embodiment of the present invention.
Figure 3B:
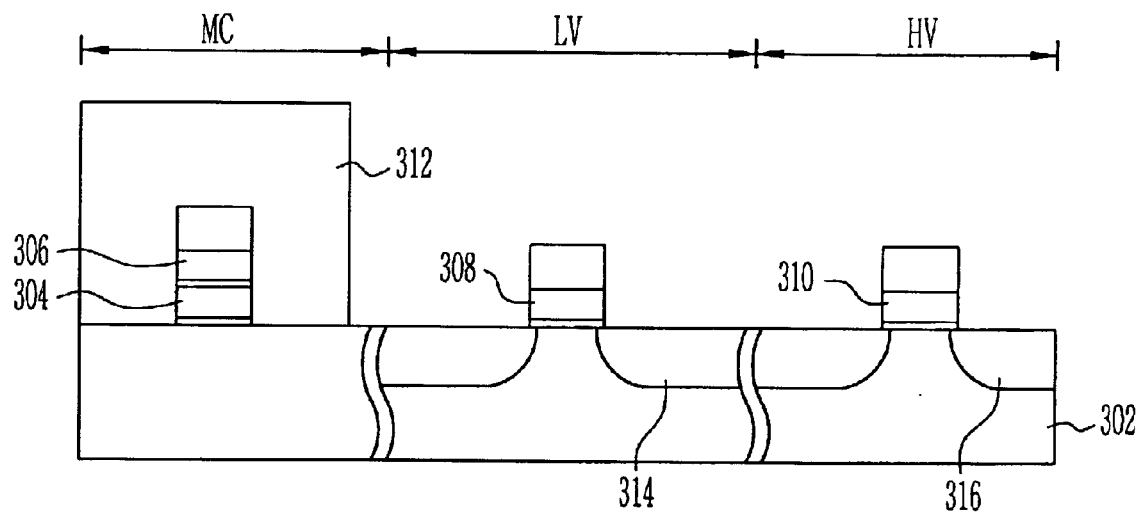
Figure 3C:
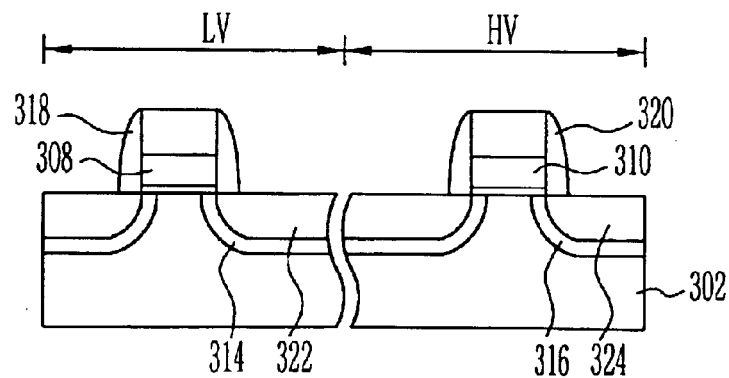

FIG. 3A through FIG. 3(c) are cross-sectional views of flash memories for explaining a method of manufacturing the flash memory device according to a preferred embodiment of the present invention.

Referring now to FIG. 3A, a semiconductor substrate 302 is divided into a cell region (MC) and a peripheral region. The peripheral region is divided into a high-voltage region (HV) to which is applied a high voltage, in which a high-voltage transistor is formed, and a low-voltage region (LV) to which is applied a low voltage, in which a low-voltage transistor is formed. Hereinafter, explanation will be given on the basis of the peripheral region. Also, the transistor formed in the high-voltage region and the low-voltage region will be explained on the basis of a NMOS transistor.

A pad oxide film (not shown) and a pad nitride film (not shown) are first sequentially deposited on a substrate 302. The entire structure is then experienced by an isolation process using an isolation mask (not shown), thus forming a trench (not shown) having a STI (shallow trench isolation) structure in the semiconductor substrate 302. At this time, it is preferred that the pad oxide film is formed in thickness of 50 Å through 150 Å and the pad nitride film is formed in thickness of over 2500 Å. Next, a gap filling process by which a trench insulating film is filled within the trench is performed to form a device isolation film. It is preferred that the insulating film is formed using a HDP (high density plasma) oxide film.

The semiconductor substrate 302 for which the device isolation process is performed is experienced by a ion implant process for forming well and a ion implant process for controlling threshold voltage, so that a well region and an impurity region (not shown) are formed at given portions of the semiconductor substrate 302. Boron B ion is then implanted into the well region of the peripheral region in which a NMOS transistor will be formed. At this time, it is preferred that B ion is implanted at the energy of 200 through 300 KeV and dose of 1.0E13 through 3.0E12 atoms/cm$^2$. Further, it is preferred that B ion is implanted at the tilt angle of 0° through 45° and the twist angle of 0° through 270°.

Then, a unit cell, on which a tunnel oxide film, a floating gate 304, a dielectric film and a control gate 306 are stacked, is formed in the cell region (MC). A gate oxide film and a polysilicon layer are formed in the peripheral region. Next, a polysilicon layer and the gate oxide film are sequentially etched by an etch process using a mask for a gate electrode pattern, thus forming gate electrodes 308 and 310. In the above, it is preferred that the polysilicon layer of the peripheral region is formed in thickness of over 500 Å. Further, a silicide film using tungsten silicon (WSi) may be formed in thickness of 500 Å through 2500 Å on the polysilicon layer. The cross section of the flash memory device after the gates are formed in the cell region and the peripheral region is shown in FIG. 3A.

By reference to FIG. 3B, a photoresist pattern 312 is formed only in the cell region so that the peripheral region is opened. Low-concentration junction regions 314 and 316 being a shallow junction are then formed in the peripheral region by performing ion implantation process using the photoresist pattern 312 as a mask. At this time, the low-concentration junction regions are simultaneously formed in the high-voltage region (HV) and the low-voltage region (LV). Also, it is preferred that phosphorous (P) is used in the ion implantation process and P is implanted at the dose of 1.0E13 through 8.0E13 atoms/cm$^2$ and energy of 40 through 90 KeV. Further, it is preferable that P ion is implanted at the tilt angle of 0° through 45° and the twist angle of 0° through 270°.

Referring to FIG. 3C, given deposition and etch processes are sequentially performed to form spacers 318 and 320 at the sidewalls of the gate electrodes 308 and 310 in the high-voltage region (HV) and the low-voltage region (LV). In the above, it is preferred that the spacers are formed by depositing high-temperature oxide (HTO) using DCS (SiH$_2$Cl$_2$) as a source in thickness of 50 Å through 300 Å at a temperature of 800° C. through 850° C. and then depositing nitride in thickness of 300 Å through 900 Å at a temperature of 700° C. through 750° C.

Next, a photoresist pattern (not shown) is formed only in the cell region so that the peripheral region is opened. High-concentration junction regions 322 and 324 being a deep junction are then formed in the peripheral region, by performing ion implantation process using the photoresist pattern. The cross section of the flash memory device after the DDD (double doped drain) structure is thus formed in the high-voltage region (HV) and the low-voltage region (LV) is shown in FIG. 3(c). At this time, it is preferred that arsenic (As) is used in the ion implantation process and As ion is implanted at the energy of 10 through 50 KeV and dose of 1.0E15 through 5.0E15 atoms/cm$^2$. Further, it is preferable that As ion is implanted at the tilt angle of 0° through 45° and the twist angle of 0° through 270°.

Next, a interlayer insulating film, a contact plug and a metal line are formed. Subsequent processes are performed same to common processes of the flash memory device. Thus, detailed explanation on them will be omitted in order to avoid overlapping.

Figures 5A, 5B:
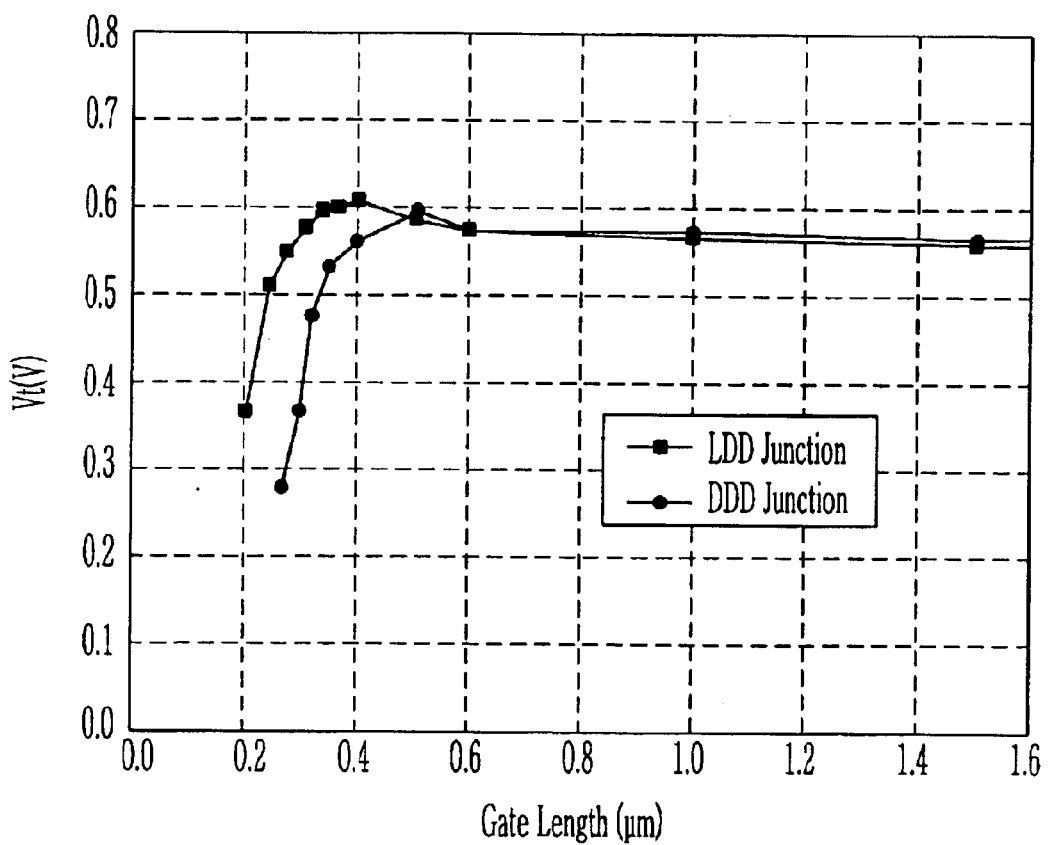
FIG. 5A and FIG. 5B illustrate data and graph for explaining device characteristics when the low-voltage transistor is formed by the present invention.
Figures 6A, 6B:
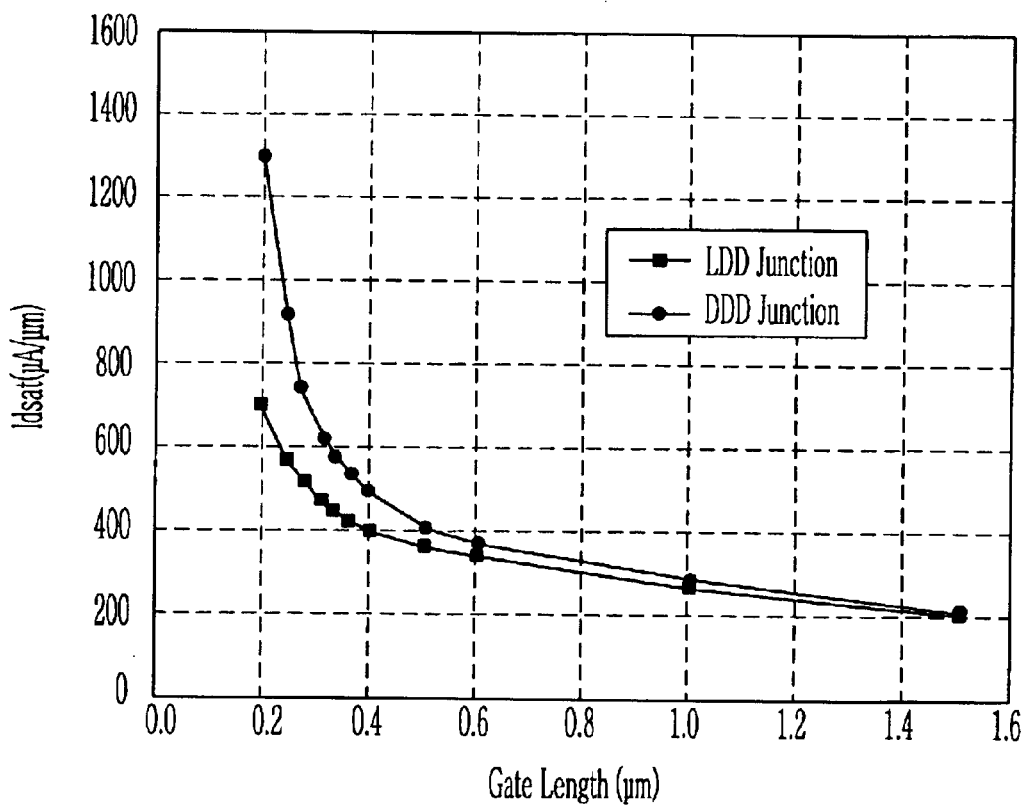
FIG. 6A and FIG. 6B illustrate data and graph for explaining device characteristics when the low-voltage transistor is formed by the present invention.

Device characteristics and lifetime when the low-voltage transistor is formed by the present invention will be below described by reference to FIG. 4 through FIG. 6.

Figure 2:
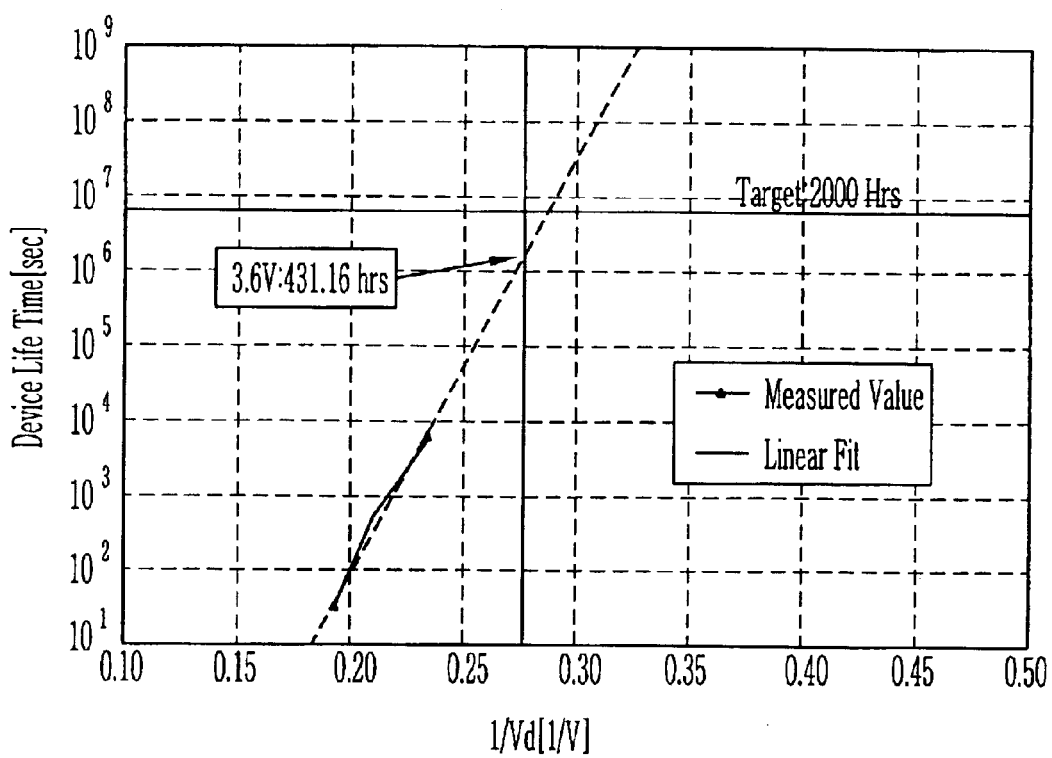
FIG. 2 is a graph for explaining the lifetime of the transistor when the low-voltage transistor is formed by the prior art.
Figure 4:
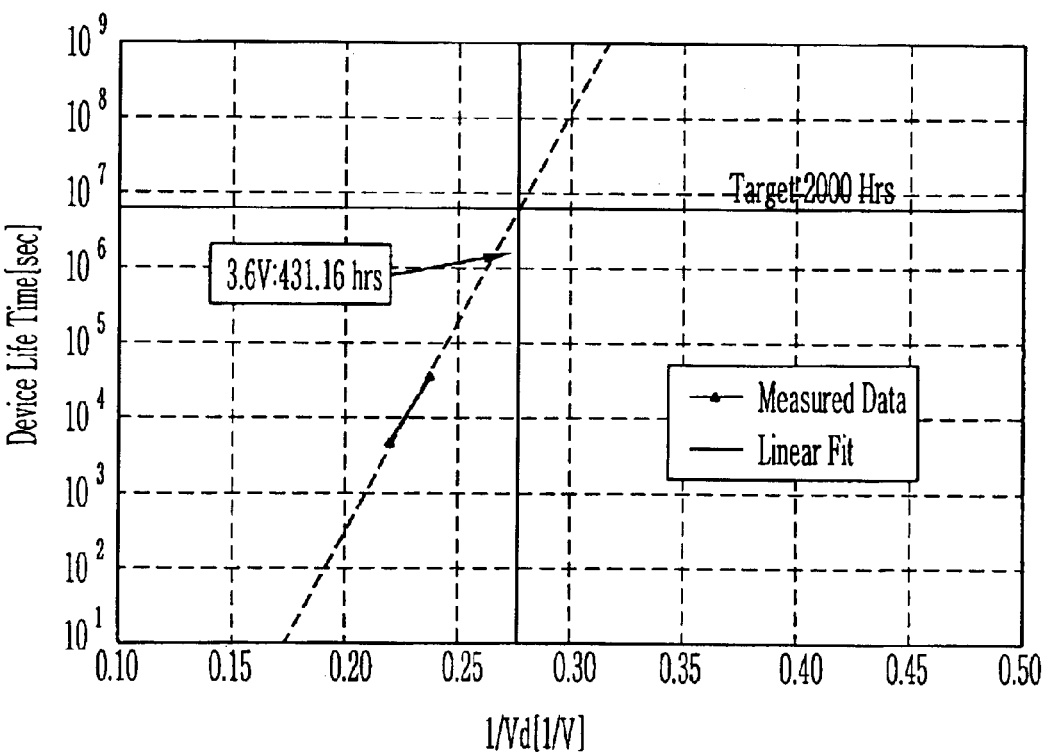
FIG. 4 is a graph for explaining the lifetime of the transistor when the low-voltage transistor is formed by the present invention.

FIG. 4 is a graph for explaining the lifetime of the transistor when the low-voltage transistor is formed by the present invention.

As described above, the conventional low-voltage transistor formed to have the LDD junction has the problem due to the hot carrier injection characteristic. In order to prevent this, in the present invention, the low-voltage transistor is formed to have the DDD junction. From FIG. 4, it can be thus seen that the lifetime of the transistor when Vd is 3.6V is 2302 hours representing an improved characteristic. This satisfies the standard of 2000 hours.

Now, device characteristics and lifetime when the low-voltage transistor is formed by the present invention will be described by reference to FIG. 5A and FIG. 5B, and FIG. 6A and FIG. 6B.

It can be seen that the low-voltage transistor (LVN) formed to have the DDD junction has improved characteristics in the gate length to the threshold voltage (Vt) and the drain current (Idsat), than the low-voltage transistor formed to have the LDD junction.

As mentioned above, according to the present invention, the low-voltage transistor in the peripheral region is formed to have the DDD structure, same to the high-voltage transistor. Therefore, the present invention has advantageous effects that it can reduce the cost in the entire process of manufacturing the flash memory device since the process for forming the LDD structure for the low voltage is omitted, and improve the device characteristics since the junction breakdown voltage of the low-voltage transistor is increased and current is increased.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a flash memory device comprising the steps of:
   (a) preparing a semiconductor substrate divided into a main cell region and a peripheral region, wherein the peripheral region is divided into a high-voltage region in which a high-voltage transistor will be formed and a low-voltage region in which a low-voltage transistor will be formed;
   (b) forming a device isolation film in the semiconductor substrate;
   (c) performing a ion implantation process for forming well and a ion implantation process for controlling threshold voltage for the substrate, thus forming a well region;
   (d) etching a polysilicon layer and a gate oxide film to form forming gates for the high-voltage transistor and the low-voltage transistor;
   (e) forming a mask in the main cell region so that the peripheral region is opened and then performing an ion implantation process directly into the semiconductor substrate for the high-voltage region and the low-voltage region, thus forming a double doped drain (DDD) low-concentration junction region;
   (f) forming spacers at sidewalls of the gates in the high-voltage region and the low-voltage region; and
   (g) forming a mask in the main cell region so that the peripheral region is opened and then performing an ion implantation process directly into the substrate under the spacers of the high-voltage region and the low-voltage region, thus forming double doped drain (DDD) high-concentration junction regions.

2. The method as claimed in claim 1, wherein the ion implantation process for forming well in the step (C) is performed using boron B under the conditions that the energy is 200 through 300 KeV, the dose is 1.0E13 through 3.0E12 atoms/cm$^2$, the tilt angle is 0° through 45° and the twist angle is 0° through 270°.

3. The method as claimed in claim 1, wherein the DDD low-concentration junction regions are formed by performing the ion implantation process using phosphorous (P) under the conditions that the energy is 40 through 90 KeV, the dose is 1.0E13 through 8.0E13 atoms/cm$^2$, the tilt angle is 0° through 45° and the twist angle is 0° through 270°.

4. The method as claimed in claim 1, wherein the DDD high-concentration junction regions are formed by performing the ion implantation process using arsenic (As) under the conditions that the energy is 10 through 50 KeV, the dose is 1.0E15 through 5.0E15 atoms/cm$^2$, the tilt angle is 0° through 45° and the twist angle is 0° through 270°.

5. The method as claimed in claim 1, wherein the step B comprises the steps of:
   forming a pad oxide film and a pad nitride film on the semiconductor substrate;
   etching the pad nitride film, the pad oxide film and the substrate using a mask defining a device isolation region, thus forming a trench;
   forming an oxide film along the sidewall of the trench;
   forming a device isolation film to bury the trench; and
   removing the pad nitride film and the pad oxide film.

6. The method as claimed in claim 5, wherein the pad oxide film is formed in thickness of 50 Å through 150 Å and the pad nitride film is formed in thickness of over 2500 Å.

7. The method as claimed in claim 1, wherein the spacers are formed using high-temperature oxide (HTO).

8. The method as claimed in claim 1, wherein the spacers are formed using nitride.

9. The method as claimed in claim 1, wherein the low-concentration junction region and the high-concentration junction region are formed to have the double doped drain structure.

10. The method as claimed in claim 1, wherein the low-concentration junction region has depth greater than the high-concentration junction region to form a double doped drain structure.

* * * * *